(12) United States Patent
Yamada et al.

(10) Patent No.: US 8,124,885 B2
(45) Date of Patent: Feb. 28, 2012

(54) ANISOTROPICALLY CONDUCTIVE CONNECTOR AND ANISOTROPICALLY CONDUCTIVE CONNECTOR DEVICE

(75) Inventors: Daisuke Yamada, Hidaka (JP); Kiyoshi Kimura, Yaenda (JP)

(73) Assignee: JSR Corporation, Tokyo (JP)

( * ) Notice: Subject to any disclaimer, the term of this patent is extended or adjusted under 35 U.S.C. 154(b) by 598 days.

(21) Appl. No.: 12/296,530

(22) PCT Filed: Mar. 30, 2007

(86) PCT No.: PCT/JP2007/057136
§ 371 (c)(1),
(2), (4) Date: Feb. 6, 2009

(87) PCT Pub. No.: WO2007/116826
PCT Pub. Date: Oct. 18, 2007

(65) Prior Publication Data
US 2009/0159325 A1     Jun. 25, 2009

(30) Foreign Application Priority Data
Apr. 11, 2006 (JP) .................................. 2006-109221

(51) Int. Cl.
*H01R 12/71* (2006.01)
*G01R 31/02* (2006.01)
*H01R 4/58* (2006.01)

(52) U.S. Cl. ... 174/265; 174/262; 174/264; 324/757.03; 439/86; 439/91

(58) Field of Classification Search .......... 174/261–262, 174/264–265; 439/86, 91; 324/757.03
See application file for complete search history.

(56) References Cited

U.S. PATENT DOCUMENTS

| | | | |
|---|---|---|---|
| 5,891,366 A * | 4/1999 | Gruenwald et al. | 252/514 |
| 6,969,622 B1 | 11/2005 | Kokubo et al. | |
| 7,160,123 B2 | 1/2007 | Yamada et al. | |
| 7,190,180 B2 | 3/2007 | Yamada et al. | |
| 7,309,244 B2 | 12/2007 | Yamada et al. | |

(Continued)

FOREIGN PATENT DOCUMENTS
CN         1496597 A        5/2004
(Continued)

OTHER PUBLICATIONS
U.S. Appl. No. 12/089,608, filed Apr. 9, 2008, Yamada, et al.
(Continued)

*Primary Examiner* — Robert J Hoffberg
(74) *Attorney, Agent, or Firm* — Oblon, Spivak, McClelland, Maier & Neustadt, L.L.P.

(57) ABSTRACT

An anisotropically conductive connector and an anisotropically conductive connector device. The anisotropically conductive connector includes a supporting member, a plurality of through-holes each extending in a thickness-wise direction of the supporting member, and anisotropically conductive sheets respectively held in the through-holes of the supporting member. Each anisotropically conductive sheet includes a frame plate, a plurality of through-holes each extending in a thickness-wise direction of the frame plate, and a plurality of anisotropically conductive elements arranged in the respective through-holes of the frame plate. Each of the anisotropically conductive elements includes a conductive part, conductive particles contained in an elastic polymeric substance in a state oriented so as to align in a thickness-wise direction of the element, and an insulating part to cover the outer periphery of the conductive part and including an elastic polymeric substance.

3 Claims, 7 Drawing Sheets

U.S. PATENT DOCUMENTS

| | | | |
|---|---|---|---|
| 7,323,712 B2 * | 1/2008 | Kokubo et al. | 257/48 |
| 7,384,280 B2 | 6/2008 | Yamada et al. | |
| 7,687,906 B2 * | 3/2010 | Tsuruko | 257/737 |
| 2006/0148285 A1 * | 7/2006 | Naoi | 439/86 |
| 2007/0178727 A1 * | 8/2007 | Igarashi et al. | 439/91 |
| 2010/0127724 A1 * | 5/2010 | Naoi et al. | 324/757 |

FOREIGN PATENT DOCUMENTS

| | | |
|---|---|---|
| EP | 1 365 479 A1 | 11/2003 |
| JP | 9 35789 | 2/1997 |
| JP | 2000 156253 | 6/2000 |
| JP | 2004 309467 | 11/2004 |
| WO | WO 2004075283 A1 * | 9/2004 |
| WO | WO 2005/096368 A1 | 10/2005 |
| WO | WO 2006008784 A1 * | 1/2006 |

OTHER PUBLICATIONS

Office Action issued Aug. 24, 2010, in Chinese Office Action No. 200780018444.6.

* cited by examiner (a)

(b)

(c)

(a)

(b)

(a)

(b)

(a)

(b)

ANISOTROPICALLY CONDUCTIVE CONNECTOR AND ANISOTROPICALLY CONDUCTIVE CONNECTOR DEVICE

TECHNICAL FIELD

The present invention relates to an anisotropically conductive connector and an anisotropically conductive connector device, which are used in, for example, inspection of circuit devices such as semiconductor integrated circuits, and particularly to an anisotropically conductive connector and an anisotropically conductive connector device, which are preferably used in inspection of circuit devices such as semiconductor integrated circuits having projected electrodes or used in a wafer inspection apparatus for inspecting large-area wafers.

BACKGROUND ART

An anisotropically conductive sheet is a sheet exhibiting conductivity only in its thickness-wise direction or having pressure-sensitive conductive conductor parts exhibiting conductivity only in the thickness-wise direction when they are pressed in the thickness-wise direction. As such anisotropically conductive sheets, there have been known those of various structures, such as those obtained by uniformly dispersing metal particles in an elastomer (see, for example, Patent Art. 1), those obtained by unevenly dispersing a conductive magnetic metal in an elastomer, thereby forming a great number of conductive parts each extending in a thickness-wise direction thereof and an insulating part for mutually insulating them (see, for example, Patent Art. 2) and those obtained by defining a difference in level between the surface of each conductive part and an insulating part (see, for example, Patent Art. 3).

In these anisotropically conductive sheets, conductive particles are contained in an insulating elastic polymeric substance in a state oriented so as to align in the thickness-wise direction, and each conductive path is formed by a chain of a great number of conductive particles.

Since such an anisotropically conductive sheet has such features that compact electrical connection can be achieved without using any means such as soldering or mechanical fitting, and that soft connection becomes feasible with mechanical shock or strain absorbed therein, it is widely used as an anisotropically conductive connector for achieving electrical connection between circuit devices, for example, electrical connection between a printed circuit board and a leadless chip carrier, liquid crystal panel or the like, in fields of, for example, electronic computers, electronic digital clocks, electronic cameras and computer key boards.

Further, as a means for achieving electrical connection between electrodes to be inspected of a circuit device, which is an object of inspection, and electrodes for inspection formed on a front surface of a circuit board for inspection in electrical inspection of circuit devices such as printed circuit boards and semiconductor integrated circuits, an anisotropically conductive sheet is used in place of a probe member, in which a plurality of pin probes are arranged corresponding to the electrode to be inspected.

However, these anisotropically conductive sheets have involved problems that when conductive parts each forming a conductive path are compressed by about 20% or more of the thickness thereof to be deformed, conductive particles adjoining one another in a horizontal direction come into contact with one another, so that conductivity is produced in not only the thickness-wise direction but also the horizontal direction to impair the anisotropic conductivity, and that the elastic polymeric substance forming the conductive parts cause permanent set to deform the conductive parts and shorten the durability of the anisotropically conductive sheets. The anisotropically conductive sheets have also involved a problem that when the thickness of the conductive parts is made great, conductive particles are oriented in not only the thickness-wise direction but also a direction of an adjoining conductive part when such an anisotropically conductive sheet is formed by applying a magnetic field, and so an insulation resistance value between the conductive parts adjoining each other is lowered to fail to achieve good electrical properties.

Therefore, the conventional anisotropically conductive sheets have involved a problem that since the anisotropically conductive sheet is pressurized by a high pressure when circuit boards wide in a scatter of height are connected, the durability upon continuous use of such an anisotropically conductive sheet becomes low.

An anisotropically conductive sheet having a large area and a great number of conductive parts is required for connection of circuit boards of, for example, a wafer inspection apparatus. When such an anisotropically conductive sheet having a large area and a great number of conductive parts is produced, however, it is difficult to provide a sheet, all the conductive parts of which have electrical properties within a certain range, so that a problem of low productivity has arisen. A problem of high production cost has also arisen because large-sized mold and magnetic field molding machine are required.

In a wafer inspection apparatus for inspecting a wafer having a diameter of, for example, 12 inches, an anisotropically conductive sheet is used for electrically connecting circuit boards for inspection to each other. This anisotropically conductive sheet is required to have a diameter of about 12 inches or more. However, when such an anisotropically conductive sheet is pinched by the circuit boards for inspection, conductive parts located at a peripheral region thereof are sufficiently compressed, whereas conductive parts located at a central region thereof are not sufficiently compressed, so that a problem that conductivity of the conductive parts becomes uneven has arisen.

When the anisotropically conductive sheet has been used repeatedly many times, the conductivity of the conductive parts located at the peripheral region, to which higher pressurizing force is applied, is lowered, so that a problem that a long working life is not achieved has arisen.

The anisotropically conductive sheet having a large area and a great number of conductive parts, which is used for connection of the circuit boards of the wafer inspection apparatus is high in production cost. When the conductivity of the conductive parts located at the peripheral region of the anisotropically conductive sheet is lowered, and the use of their conductive parts becomes difficult when inspection of wafers is made repeatedly many times, the anisotropically conductive sheet itself must be exchanged for a new anisotropically conductive sheet, so that a problem that inspection cost of inspection of the wafers increases has arisen.

Patent Art. 1: Japanese Patent Application Laid-Open No. 93393/1976;
Patent Art. 2: Japanese Patent Application Laid-Open No. 147772/1978;
Patent Art. 3: Japanese Patent Application Laid-Open No. 250906/1986.

DISCLOSURE OF THE INVENTION

The present invention has been made on the basis of the foregoing circumstances and has as its first object the provision of an anisotropically conductive sheet, by which electrical properties within a certain range can be achieved in all conductive parts thereof even when the anisotropically conductive connector has a large area and a great number of conductive parts, and production cost is low.

The second object of the present invention is to provide an anisotropically conductive connector device, by which good electrical connection can be achieved with a low pressure for circuit boards wide in a scatter of height, and a long working life is achieved even when it is used repeatedly.

The third object of the present invention is to provide an anisotropically conductive connector and an anisotropically conductive connector device, by which uniform conductivity is achieved in all conductive parts when they are pressurized even when the anisotropically conductive connector has a large area of, for example, 8 inches or more in diameter.

The fourth object of the present invention is to provide an anisotropically conductive connector and an anisotropically conductive connector device, by which conductive parts located at a peripheral region of the anisotropically conductive connector are prevented from lowering conductivity even when the anisotropically conductive connector has a large area of, for example, 8 inches or more in diameter and is used repeatedly many times, so that a long working life is achieved.

Means for the Solution of the Problems

An anisotropically conductive connector according to the present invention comprises:

a supporting member, in which a plurality of through-holes each extending in a thickness-wise direction of the supporting member have been formed, and anisotropically conductive sheets respectively held in the through-holes of the supporting member.

In the anisotropically conductive connector according to the present invention, it may be preferable that each of the anisotropically conductive sheets is composed of a frame plate, in which a plurality of through-holes each extending in a thickness-wise direction of the frame plate have been formed, and a plurality of anisotropically conductive elements arranged in the respective through-holes of the frame plate, and that each of the anisotropically conductive elements is formed by a conductive part, in which conductive particles are contained in an elastic polymeric substance in a state oriented so as to align in a thickness-wise direction of the element, and an insulating part formed so as to cover the outer periphery of the conductive part and composed of an elastic polymeric substance.

It is also preferable that an insulating layer composed of an elastic polymeric substance is formed so as to cover the surface of the frame plate of the anisotropically conductive sheet.

It is further preferable that each of the conductive parts is formed in a state protruded from a surface of the insulating part.

In such an anisotropically conductive connector, the thickness of the conductive parts of the anisotropically conductive sheets arranged in a peripheral region of the supporting member may preferably be smaller than the thickness of the conductive parts of the anisotropically conductive sheets arranged in a central region of the supporting member.

The durometer hardness of the elastic polymeric substance forming the conductive parts of the anisotropically conductive sheets arranged in the peripheral region of the supporting member may preferably be higher than the durometer hardness of the elastic polymeric substance forming the conductive parts of the anisotropically conductive sheets arranged in the central region of the supporting member.

The content of the conductive particles contained in the conductive parts of the anisotropically conductive sheets arranged in the peripheral region of the supporting member may preferably be higher than the content of the conductive particles contained in the conductive parts of the anisotropically conductive sheets arranged in the central region of the supporting member.

An anisotropically conductive connector device according to the present invention comprises a connecting board, a first anisotropically conductive connector provided on a front surface of the connecting board and a second anisotropically conductive connector provided on a back surface of the connecting board, wherein the first anisotropically conductive connector and the second anisotropically conductive connector are each the anisotropically conductive connector described above.

In the anisotropically conductive connector device according to the present invention, the connecting board may preferably be composed of an insulating sheet and a plurality of electrode structures each extending through in a thickness-wise direction of the insulating sheet.

Effects of the Invention

According to the anisotropically conductive connector of the present invention, a plurality of anisotropically conductive sheets small in area and little in the number of conductive parts are joined to one another by the supporting member, so that electrical properties within a certain range can be surely achieved in all the conductive parts even when the connector has a large area and a great number of conductive parts as a whole.

It is only necessary to produce anisotropically conductive sheets small in area and little in the number of conductive parts, so that large-sized mold and molding machine are not required, and the anisotropically conductive connector can thus be produced at low cost.

As the plural anisotropically conductive sheets joined by the supporting member, those having properties different from one another are used, thereby achieving the following effects.

According to the construction that the conductive parts of the anisotropically conductive sheets arranged in the peripheral region of the supporting member have a thickness smaller than that of the conductive parts of the anisotropically conductive sheets arranged in the central region, the conductive parts of the anisotropically conductive sheets arranged in the central region are sufficiently compressed when they are pressurized, so that uniform conductivity is achieved in all the conductive parts even when the anisotropically conductive connector has a large area.

According to the construction that the conductive parts of the anisotropically conductive sheets arranged in the peripheral region of the supporting member are composed of the elastic polymeric substance having a durometer hardness higher than that of the conductive parts of the anisotropically conductive sheets arranged in the central region, the conductive parts of the anisotropically conductive sheets arranged in the central region are sufficiently compressed with small pressurizing force, so that uniform conductivity is achieved in all the conductive parts even when the anisotropically conductive connector has a large area.

According to the construction that the conductive parts of the anisotropically conductive sheets arranged in the peripheral region of the supporting member contain the conductive particles in a proportion higher than that of the conductive parts of the anisotropically conductive sheets arranged in the central region, the conductive parts located at the peripheral region are prevented from lowering conductivity even when the anisotropically conductive connector is used repeatedly many times, so that a long working life is achieved.

According to the anisotropically conductive connector of the present invention, when the conductivity of the conductive parts of the anisotropically conductive sheets arranged in, for example, the peripheral region of the supporting member is lowered, and the use of their conductive parts becomes difficult when the anisotropically conductive connector is used repeatedly many times in, for example, inspection of wafers, it is only necessary to exchange only an anisotropically conductive sheet containing such conductive parts for a new anisotropically conductive sheet, so that the whole anisotropically conductive connector is not required to be exchanged for a new anisotropically conductive connector, and inspection cost can thus be reduced.

According to the anisotropically conductive connector device of the present invention, the connecting board is arranged between the above-described two anisotropically conductive connectors, so that good electrical connection can be achieved with a low pressure for circuit boards wide in a scatter of height, and a long working life is achieved even when it is used repeatedly.

DESCRIPTION OF CHARACTERS

Figure 1:
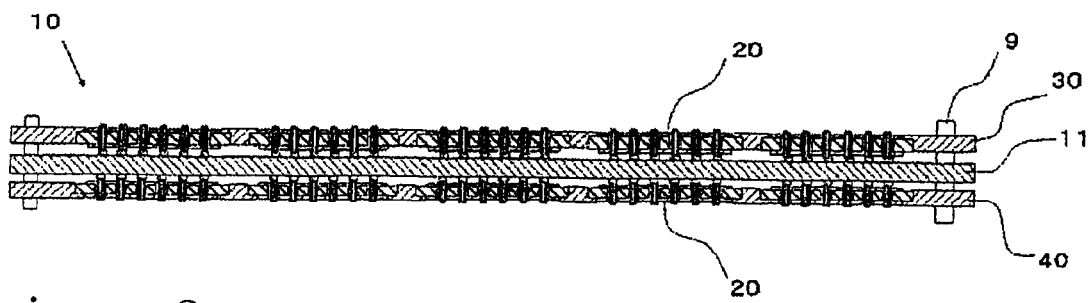
FIG. 1 is a cross-sectional view illustrating the construction of an exemplary anisotropically conductive connector device according to the present invention.

1 Circuit board for inspection
2 Circuit board for connection
5 Electrode
6 Electrode
9 Guide pin
10 Anisotropically conductive connector device
11 Connecting board
12 Insulating sheet
13 Electrode structure
14 Front-surface electrode part
15 Back-surface electrode part
16 Short circuit part
17 Wiring
20 Anisotropically conductive sheet
20A Molding material layer
21 Conductive part
21A Portion to become a conductive part
22 Insulating part
23 Frame plate
23K Through-hole
24 Anisotropically conductive element
25 Anisotropically conductive film
29 Insulating layer
30 First anisotropically conductive connector
40 Second anisotropically conductive connector
50 Top force
51 Ferromagnetic substance substrate
52 Ferromagnetic substance layer
53 Non-magnetic substance layer
54 Spacer
55 Bottom force
56 Ferromagnetic substance substrate
57 Ferromagnetic substance layer
58 Non-magnetic substance layer
70 Supporting member
71 Through-hole
72 Holding part
73 Positioning hole
P Conductive particles

BEST MODE FOR CARRYING OUT THE INVENTION

The embodiments of the present invention will hereinafter be described in details.

FIG. 1 is a cross-sectional view illustrating the construction of an exemplary anisotropically conductive connector device according to the present invention. This anisotropically conductive connector device 10 is used for conducting electrical connection between electrodes of a circuit board for inspection in a wafer inspection apparatus and electrodes of a circuit board for connection by intervening between the circuit board for inspection and the circuit board for connection.

The anisotropically conductive connector device 10 illustrated in FIG. 1 has a rectangular connecting board 11, a rectangular first anisotropically conductive connector 30 provided on a front surface of this connecting board 11 and a rectangular second anisotropically conductive connector 40 provided on a back surface of the connecting board 11.

The first anisotropically conductive connector 30 and the second anisotropically conductive connector 40 are each composed of a supporting member 70, in which a plurality of through-holes 71 each extending in a thickness-wise direction of the supporting member have been formed, and anisotropically conductive sheets 20 respectively held in the through-holes 71 of the supporting member 70.

Figure 2:
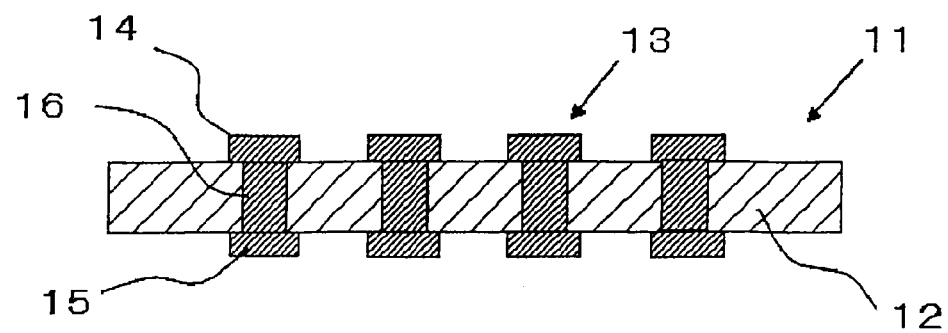
FIG. 2 is a cross-sectional view illustrating examples of a connecting board used in the anisotropically conductive connector device according to the present invention.
Figure 2:
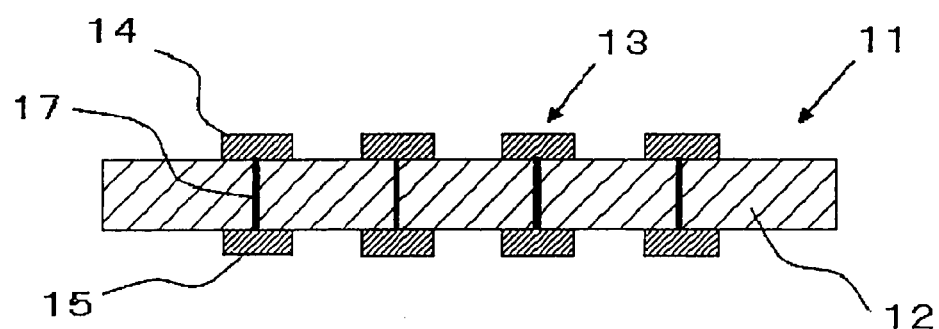
Figure 2:
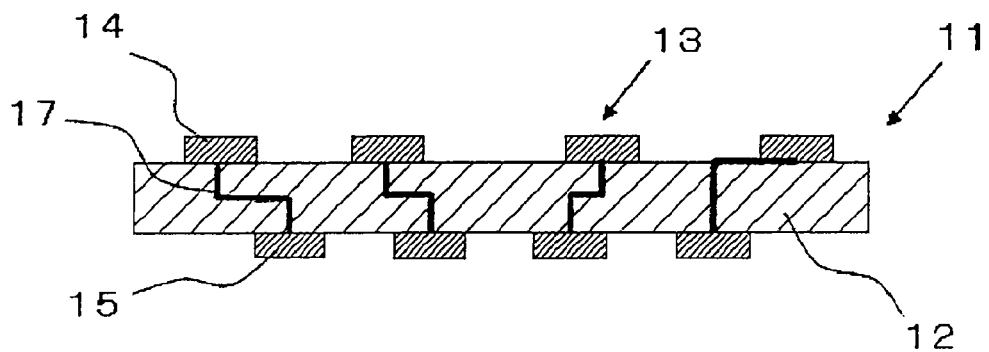

As the connecting board 11, may be used, for example, that having a structure illustrated in FIG. 2 (a), (b) or (c).

Specifically, a connecting board 11 illustrated in FIG. 2(a) has a rectangular insulating sheet 12, and in this insulating sheet 12, a plurality of electrode structures 13 extending through in a thickness-wise direction of the insulating sheet 12 and composed of a metal are arranged in a state separated from one another in a plane direction of the insulating sheet 12 in accordance with a pattern corresponding to a pattern of electrodes to be connected.

Each of the electrode structures 13 is formed by integrally connecting a disk-like front-surface electrode part 14 exposed to a front surface (upper surface in FIG. 2(a)) of the insulating sheet 12 and a disk-like back-surface electrode part 15 exposed to a back surface (lower surface in FIG. 2(a)) of the insulating sheet 12 to each other by a short circuit part 16 extending through in the thickness-wise direction of the insulating sheet 12.

In the connecting board 11 of this embodiment, positioning holes (not illustrated) are respectively formed at positions of four corners of the insulating sheet 12.

A connecting board 11 illustrated in FIG. 2(b) is obtained by forming a plurality of front-surface electrode parts 14 on a front surface of an insulating sheet 12 and a plurality of back-surface electrode parts 15 on a back surface of the insulating sheet 12 in a state separated from one another in a plane direction of the insulating sheet 12 in accordance with a pattern corresponding to a pattern of electrodes to be connected. Each of the front-surface electrode parts 14 is electrically connected to its corresponding back-surface electrode part 15 through a wiring 17 formed in the insulating sheet 12 by through-hole plating or the like.

A connecting board 11 illustrated in FIG. 2(c) is obtained by forming a plurality of front-surface electrode parts 14 on a front surface of an insulating sheet 12 in a state separated from one another in a plane direction of the insulating sheet 12 in accordance with a pattern corresponding to a pattern of conductive parts of the first anisotropically conductive connector 30, and forming a plurality of back-surface electrode parts 15 on a back surface of the insulating sheet 12 in a state separated from one another in the plane direction of the insulating sheet 12 in accordance with a pattern corresponding to a pattern of conductive parts of the second anisotropically conductive connector 40. Each of the front-surface electrode parts 14 is electrically connected to its corresponding back-surface electrode part 15 through a wiring 17 formed in the insulating sheet 12 by through-hole plating, surface wiring, interlayer wiring or the like.

As a material for forming the insulating sheet 12, may be used a glass fiber-reinforced epoxy resin, glass fiber-reinforced polyimide resin, glass fiber-reinforced bismaleimide triazine resin, polyimide resin, liquid crystal polymer or the like.

The thickness of the insulating sheet 12 is, for example, 20 to 500 μm.

As a material for forming the front-surface electrode parts 14 and the back-surface electrode parts 15, may be used nickel, copper, silver, palladium, iron or the like. The front-surface electrode parts 14 and the back-surface electrode parts 15 may be those formed of a simple metal as a whole, those formed of an alloy of at least two metals or those obtained by laminating at least two metals. The surfaces of the front-surface electrode parts 14 and the back-surface electrode parts 15 are preferably formed by a chemically stable metal having high conductivity, such as gold, silver or palladium in that oxidation of the electrode parts is prevented, and electrode parts small in contact resistance are obtained.

Figure 3:
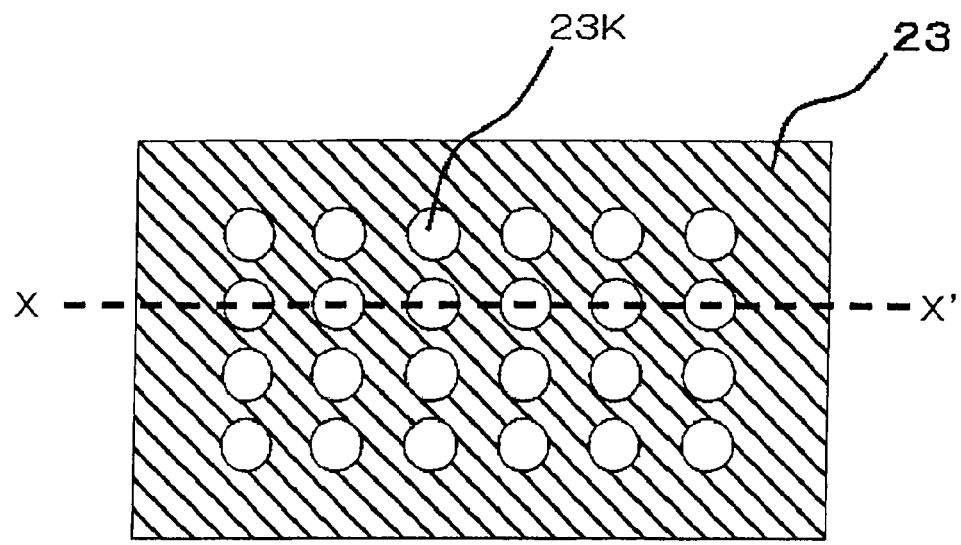
FIG. 3 illustrates the construction of a frame plate in an anisotropically conductive sheet used in an anisotropically conductive connector according to the present invention, in which (a) is a plan view, and (b) is a cross-sectional end view taken along line X-X' in (a).
Figure 3:
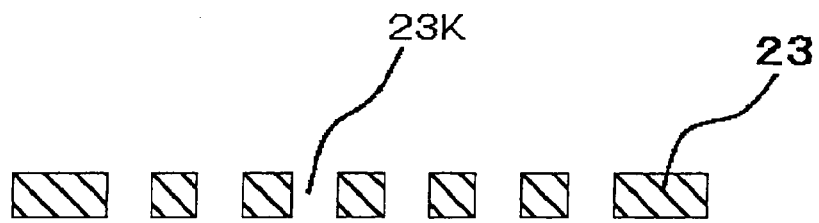

In the first anisotropically conductive connector 30, each of the anisotropically conductive sheets 20 has a frame plate 23 composed of, for example, a hard material, in which a plurality of through-holes 23K each extending in a thickness-wise direction of the frame plate and having a rectangular sectional form have been formed in accordance with a specific pattern as illustrated in FIG. 3.

The specific pattern of the through-holes 23K in this frame plate 23 is arranged in accordance with a pattern corresponding to the pattern of the front-surface electrode parts 14 in the connecting board 11.

Figure 4:
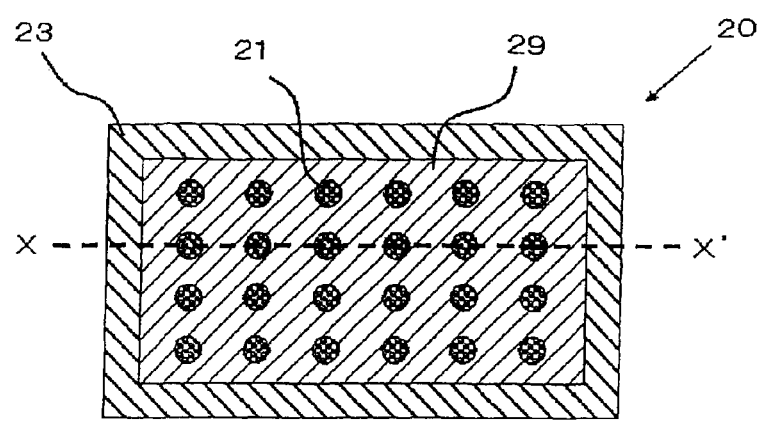
FIG. 4 illustrates the construction of the anisotropically conductive sheet used in the anisotropically conductive connector according to the present invention, in which (a) is a plan view, and (b) is a cross-sectional view taken along line X-X' in (a).
Figure 4:
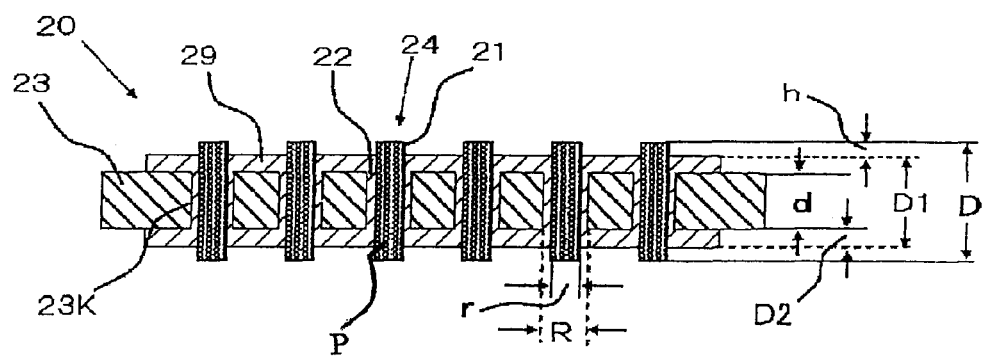

In the anisotropically conductive sheet 20, anisotropically conductive elements 24 are respectively held in the through-holes 23K of the frame plate 23 in a state protruded from the surfaces of the frame plate 23 as illustrated in FIG. 4.

This anisotropically conductive element 24 is formed by a columnar conductive part 21 extending in the thickness-wise direction of the anisotropically conductive sheet 20 and a cylindrical insulating part 22 formed so as to cover an outer periphery of this conductive part 21, and the conductive part 21 is formed in a state protruded from the surfaces of the insulating part 22. In the illustrated embodiment, the insulating part 22 in each of the anisotropically conductive elements 24 is formed so as to cover the surfaces of the frame plate 23 and integrally joined to the insulating part 22 of an adjoining anisotropically conductive element 24, whereby an insulating layer 29 composed of an elastic polymeric substance is formed on the surfaces of the frame plate 23. The conductive part 21 is formed by causing conductive particles to be contained in an elastic polymeric substance in a state oriented so as to align in the thickness-wise direction of the anisotropically conductive sheet, and a conductive path is formed in a thickness-wise direction of the anisotropically conductive element 24 by a chain of the conductive particles. On the other hand, the insulating part 22 is formed by an insulating elastic polymeric substance.

The thickness d of the frame plate 23 is controlled smaller than the whole thickness (thickness D of the conductive part 21 in this example) of the anisotropically conductive element 24 because the anisotropically conductive element 24 is required to be held in the state protruded from the surfaces of the frame plate 23. However, the thickness d is preferably 10% or more, particularly 12% or more of the thickness D of the conductive part 21 of the anisotropically conductive element 24. If the thickness d of the frame plate 23 is less than 10% of the thickness D of the conductive part 21, it may be difficult in some cases to sufficiently inhibit the chain of the conductive particles in the conductive part 21 from being curved when the anisotropically conductive element 24 is pressurized. Specifically, the thickness d of the frame plate 23 is preferably 0.02 to 0.5 mm, particularly 0.05 to 0.2 mm.

The diameter r of the conductive part 21 of the anisotropically conductive element 24 is preferably 30% or more, more preferably 30 to 80%, particularly preferably 50 to 75% of a diameter R (meaning a length of a side when the section is rectangular) of the through-hole 23K of the frame plate 23. If the diameter r of the conductive part 21 is less than 20% of the diameter R of the through-hole 23K of the frame plate 23, the wall thickness of the insulating part 22 in the plane direction becomes too great, so that it may be difficult in some cases to sufficiently inhibit the chain of the conductive particles in the conductive part 21 from being curved. If the diameter r of the conductive part 21 exceeds 90% of the diameter R of the through-hole 23K of the frame plate 23 on the other hand, the wall thickness of the insulating part 22 in the plane direction becomes too small, so that the deformation of the conductive part 21 in the plane direction is over-inhibited when the anisotropically conductive element 24 is pressurized, whereby considerably great stress is applied to the conductive part 21, and so the conductive part 21 is easy to prematurely cause permanent set. Here, the diameter of the through-hole 23K of the frame plate 23 is preferably 0.2 to 2 mm, more preferably 0.25 to 1 mm, particularly preferably 0.3 to 0.7 mm.

Specifically, the diameter r of the conductive part 21 of the anisotropically conductive element 24 is suitably set according to the diameter of an electrode to be connected, for example, an electrode to be inspected of a circuit device that is an object of inspection, and is generally 0.1 to 1 mm, preferably 0.15 to 0.7 mm, more preferably 0.2 to 0.6 mm. The thickness D of the conductive part 21 of the anisotropically conductive element 24 is generally 0.1 to 2 mm, preferably 0.15 to 1 mm, more preferably 0.2 to 0.8 mm.

When each conductive part 21 is formed in the state protruded from the surfaces of the insulating part 22 like the illustrated embodiment, the projected height h of the conductive part 21 from the surface of the insulating part 22 is preferably 5 to 50%, particularly 10 to 30% of the thickness D1 of the insulating part 22. Specifically, the projected height h of the conductive part 21 is preferably 0.01 to 0.1 mm, particularly preferably 0.04 to 0.06 mm. The conductive part 21 is formed in the state protruded from the surfaces of the insulating part 22 like this, whereby good load-strain property is achieved in the conductive part 21, so that necessary conductivity for the conductive parts 21 for connection are surely attained when the anisotropically conductive element 24 is pressurized. In addition, stable electrical connection can be surely achieved to a circuit device, in which electrodes to be connected are small in area, and a resist layer projecting over the electrodes is formed around the electrodes.

The thickness D2 of the insulating layer 29 is preferably set within a range that the surface of the insulating layer 29 does not protrude over the surface of the conductive part 21 of the anisotropically conductive element 24. Specifically, the thickness is preferably 0.3 mm or less, particularly 0.05 to 0.1 mm. Such an insulating layer 29 is formed, whereby when the resulting anisotropically conductive connector is electrically connected to an object to be connected, for example, a circuit device to be inspected, the elasticity of the insulating layer 29 can prevent the circuit device to be inspected from being damaged. When the frame plate 23 is formed by a metal, necessary insulating property can be surely achieved by the insulating layer 29. In addition, the insulating layer 29 is integrally formed with the insulating parts 22 in the anisotropically conductive elements 24, whereby the anisotropically conductive elements 24 are stably held in the through-holes 23K of the frame plate 23, and so the anisotropically conductive elements 24 can be prevented from falling off from the through-holes 23K of the frame plate 23.

In the present invention, the thickness of the conductive parts 21 of the anisotropically conductive sheets 20 arranged in a peripheral region of the supporting member 70 is preferably smaller than the thickness of the conductive parts 21 of the anisotropically conductive sheets 20 arranged in a central region of the supporting member 70.

According to such construction, the conductive parts of the anisotropically conductive sheets arranged in the central region of the supporting member 70 are sufficiently compressed when they are pressurized, so that uniform conductivity is achieved in all the conductive parts even when the anisotropically conductive connector has a large area.

A coating layer may be formed with a metal such as gold, silver, rhodium, palladium, ruthenium, tungsten, molybdenum, platinum or iridium on the surfaces of the conductive parts 21.

Such a coating layer can be formed on the surfaces of the conductive parts by a method such as plating or sputtering, or may also be formed on the surfaces of the conductive parts 21 by a method that a separately formed metal member for contacts is bonded or transferred.

The hard material forming the frame plate 23, is preferably used that may have a Rockwell hardness measured according to JIS Z 2245-1981.

As the hard material forming the frame plate 23, is preferably used that having a coefficient of linear thermal expansion of at most $1.5 \times 10^{-4}$/K, particularly preferably $1 \times 10^{-4}$/K to $1 \times 10^{-7}$/K. Such a hard material is used, whereby the resulting frame plate 23 is prevented from deforming following the deformation of the conductive parts 21 of the anisotropically conductive elements 24 in the plane direction. As a result, the deformation of the conductive parts 21 in the plane direction can be surely inhibited. If this coefficient of linear thermal expansion exceeds $2 \times 10^{-4}$/K, the whole anisotropically conductive sheet is greatly thermally expanded when subjected to thermal hysteresis by temperature change, so that positional deviation occurs between electrodes to be inspected of a circuit device to be inspected and the conductive parts of the anisotropically conductive sheet. As a result, it may be difficult in some cases to retain a stable connected state. As the hard material forming the frame plate 23, is preferably used that having a coefficient of linear thermal expansion equal or approximate to the coefficient of linear thermal expansion of a material forming a base of an object to be connected, for example, a circuit device to be inspected or a circuit board for inspection, specifically a coefficient of linear thermal expansion that a difference from the coefficient of linear thermal expansion of the material forming the base of the object to be connected is at most $1 \times 10^{-5}$/K.

Specific examples of the hard material forming such a frame plate 23 include metallic materials such as stainless steel, iron, copper, nickel, chromium, cobalt, manganese, molybdenum, indium, lead, titanium, tungsten, aluminum, gold, silver and alloys of two or more metals thereof; resin materials such as polyimide, polyester, polyamide; composite resin materials such as glass fiber-reinforced epoxy resins, glass fiber-reinforced polyester resins and glass fiber-reinforced polyimide resins; and polyphenylene sulfide, poly (ether ether ketone), alamide fibers and fluorocarbon fibers.

As the elastic polymeric substance forming the conductive parts 21 in the anisotropically conductive elements 24, is preferred a polymeric substance having a crosslinked structure. As a curable polymeric substance-forming material usable for obtaining such an elastic polymeric substance, may be used various materials. In particular, silicone rubber is preferably used from the viewpoints of molding and processing ability and electrical properties.

As the silicone rubber, is preferred that obtained by crosslinking or condensing liquid silicone rubber. The liquid silicone rubber preferably has a viscosity not higher than $10^5$ poises as measured at a shear rate of $10^{-1}$ sec and may be any of condensation type, addition type and those having a vinyl group or hydroxyl group. As specific examples thereof, may be mentioned dimethyl silicone raw rubber, methylvinyl silicone raw rubber and methylphenylvinyl silicone raw rubber.

Among these, vinyl group-containing liquid silicone rubber (vinyl group-containing dimethyl polysiloxane) is generally obtained by subjecting dimethyldichlorosilane or dimethyldialkoxysilane to hydrolysis and condensation reaction in the presence of dimethylvinylchlorosilane or dimethylvinylalkoxy-silane and then fractionating the reaction product by, for example, repeated dissolution-precipitation. Liquid silicone rubber having vinyl groups at both terminals thereof is obtained by subjecting a cyclic siloxane such as octamethylcyclotetrasiloxane to anionic polymerization in the presence of a catalyst, using, for example, dimethyldivinylsiloxane as a polymerization terminator and suitably selecting other reaction conditions (for example, amounts of the cyclic siloxane and polymerization terminator). As the catalyst for the anionic polymerization, may be used an alkali such as tetramethylammonium hydroxide or n-butylphosphonium hydroxide or a silanolate solution thereof. The reaction is conducted at a temperature of, for example, 80 to 130° C. Such a vinyl group-containing dimethyl polysiloxane preferably has a molecular weight Mw (weight average molecular weight as determined in terms of standard polystyrene; the same shall apply hereinafter) of 10,000 to 40,000. It also preferably has a molecular weight distribution index (a ratio Mw/Mn of weight average molecular weight Mw as determined in terms of standard polystyrene to number average molecular weight Mn as determined in terms of standard polystyrene; the same shall apply hereinafter) of at most 2 from the viewpoint of the heat resistance of the resulting conductive path elements.

On the other hand, hydroxyl group-containing liquid silicone rubber (hydroxyl group-containing dimethyl polysiloxane) is generally obtained by subjecting dimethyldichlorosilane or dimethyldialkoxysilane to hydrolysis and condensation reaction in the presence of dimethylhydrochlorosilane or dimethylhydroalkoxysilane and then fractionating the reaction product by, for example, repeated dissolution-precipitation. The hydroxyl group-containing liquid silicone rubber is also obtained by subjecting a cyclic siloxane to anionic polymerization in the presence of a catalyst, using, for example, dimethylhydrochlorosiloxane, methyldihydrochlorosilane or dimethylhydroalkoxysilane as a polymerization terminator and suitably selecting other reaction conditions (for example, amounts of the cyclic siloxane and polymerization terminator). As the catalyst for the anionic polymerization, may be used an alkali such as tetramethylammonium hydroxide or n-butylphosphonium hydroxide or a silanolate solution thereof. The reaction is conducted at a temperature of, for example, 80 to 130° C. Such a hydroxyl group-containing dimethyl polysiloxane preferably has a molecular weight Mw of 10,000 to 40,000. It also preferably has a molecular weight distribution index of at most 2 from the viewpoint of the heat resistance of the resulting anisotropically conductive elements 24. In the present invention, any one of the above-described vinyl group-containing dimethyl polysiloxane and hydroxyl group-containing dimethyl polysiloxane may be used, or both may also be used in combination.

As the conductive particles used in the conductive parts 21 in the anisotropically conductive elements 24, conductive particles exhibiting magnetism are preferably used in that such particles can be easily oriented by a process, which will be described subsequently. Specific examples of such conductive particles include particles of metals exhibiting magnetism, such as iron, cobalt and nickel, particles of alloys thereof, particles containing such a metal, particles obtained by using these particles as core particles and plating surfaces of the core particles with a metal having good conductivity, such as gold, silver, palladium or rhodium, particles obtained by using particles of a non-magnetic metal, particles of an inorganic substance, such as glass beads, or particles of a polymer as core particles and plating surfaces of the core particles with a conductive magnetic metal such as nickel or cobalt, and particles obtained by coating core particles with both conductive magnetic substance and metal having good conductivity. Among these, particles obtained by using nickel particles as core particles and plating their surfaces with a metal such as gold, silver, rhodium, palladium, ruthenium, tungsten, molybdenum, platinum or iridium are preferably used, and particles obtained by coating nickel particles with a plurality of different metals, such as particles obtained by plating nickel particles with silver as a primer coating and then with gold as a surface coating are also preferably used.

No particular limitation is imposed on the means for coating the surfaces of the core particles with the conductive metal. However, the coating may be conducted by, for example, chemical plating or electroplating.

When those obtained by coating the surfaces of the core particles with the conductive metal are used as the conductive particles, the coating rate (proportion of an area coated with the conductive metal to the surface area of the core particles) of the conductive metal on the particle surfaces is preferably at least 40%, more preferably at least 45%, particularly preferably 47 to 95% from the viewpoint of achieving good conductivity. The amount of the conductive metal to coat is preferably 0.5 to 50% by weight, more preferably 2 to 30% by weight, still more preferably 3 to 25% by weight, particularly preferably 4 to 20% by weight based on the core particles. When the conductive metal to coat is gold, the coating amount thereof is preferably 0.5 to 30% by weight, more preferably 2 to 20% by weight, still more preferably 3 to 15% by weight, particularly preferably 4 to 10% by weight based on the core particles. When the conductive metal to coat is silver, the coating amount thereof is preferably 4 to 50% by weight, more preferably 5 to 40% by weight, still more preferably 10 to 30% by weight based on the core particles.

The particle diameter of the conductive particles is preferably 1 to 1,000 μm, more preferably 2 to 500 μm, still more preferably 5 to 300 μm, particularly preferably 10 to 200 μm. The particle diameter distribution (Dw/Dn) of the conductive particles is preferably 1 to 10, more preferably 1.01 to 7, still more preferably 1.05 to 5, particularly preferably 1.1 to 4. Conductive particles satisfying such conditions are used, whereby the resulting conductive parts 21 become easy to deform under pressure, and sufficient electrical contact is achieved among the conductive particles in the conductive parts 21. No particular limitation is imposed on the form of the conductive particles. However, they are preferably in the form of a sphere or star, or a mass of secondary particles obtained by aggregating these particles from the viewpoint of permitting easy dispersion of the conductive particles in the polymeric substance-forming material.

The water content in the conductive particles is preferably at most 5%, more preferably at most 3%, still more preferably at most 2%, particularly preferably at most 1%. The use of conductive particles satisfying such conditions prevents or inhibits occurrence of bubbles in the molding material layer when the molding material layer is subjected to a curing treatment in the production process, which will be described subsequently.

Those obtained by treating surfaces of the conductive particles with a coupling agent such as a silane coupling agent may be suitably used. By treating the surfaces of the conductive particles with the coupling agent, the adhesion property of the conductive particles to the elastic polymeric substance is improved, so that the resulting conductive parts 21 become high in durability in repeated use. The amount of the coupling agent used is suitably selected within limits not affecting the conductivity of the conductive particles. However, it is preferably such an amount that a coating rate (proportion of an area coated with the coupling agent to the surface area of the conductive core particles) of the coupling agent on the surfaces of the conductive particles amounts to at least 5%, more preferably 7 to 100%, still more preferably 10 to 100%, particularly preferably 20 to 100%.

Such conductive particles are preferably used in a proportion of 30 to 60%, more preferably 35 to 50% in terms of volume fraction to the polymeric substance-forming material. If this proportion is lower than 30%, conductive parts 21 sufficiently low in electric resistance value may not be obtained in some cases. If this proportion exceeds 60% on the other hand, the resulting conductive parts 21 are liable to be brittle, so that elasticity required of the conductive parts 21 may not be achieved in some cases.

In the present invention, the durometer hardness of the elastic polymeric substance forming the conductive parts 21 of the anisotropically conductive sheets 20 arranged in the peripheral region of the supporting member 70 is preferably higher than the durometer hardness of the elastic polymeric substance forming the conductive parts 21 of the anisotropically conductive sheets 20 arranged in the central region of the supporting member 70.

According to such construction, the conductive parts 21 of the anisotropically conductive sheets 20 arranged in the central region of the supporting member 70 are sufficiently compressed with small pressurizing force, so that uniform conductivity is achieved in all the conductive parts 21 even when the anisotropically conductive connector has a large area.

Further, the content of the conductive particles contained in the conductive parts 21 of the anisotropically conductive sheets 20 arranged in the peripheral region of the supporting member 70 is preferably higher than the content of the conductive particles contained in the conductive parts 21 of the anisotropically conductive sheets 20 arranged in the central region of the supporting member 70.

According to such construction, the conductive parts 21 of the anisotropically conductive sheets 20 arranged in the peripheral region of the supporting member 70 are prevented from lowering conductivity even when the anisotropically conductive connector is used repeatedly many times, so that a long working life is achieved.

As the elastic polymeric substance forming the insulating parts 22 in the anisotropically conductive elements 24, is preferred a polymeric substance having a crosslinked structure. As a curable polymeric substance-forming material usable for obtaining such an elastic polymeric substance, may be used various materials. In particular, silicone rubber is preferably used from the viewpoints of molding and processing ability and electrical properties. The elastic polymeric substance used for forming the insulating parts 22 may be the same or different from the elastic polymeric substance forming the conductive parts 21. The insulating part 22 may be integral with or separate from the conductive part 21.

As the elastic polymeric substance forming the insulating layer 29, is preferred a polymeric substance having a crosslinked structure. As specific examples of curable polymeric substance-forming materials usable for obtaining such an elastic polymeric substance, may be the same substances exemplified as the polymeric substance-forming materials for obtaining the elastic polymeric substance forming the insulating parts 22 in the anisotropically conductive elements 24. The elastic polymeric substance used for forming the insulating layer 29 may be the same or different from the elastic polymeric substance forming the insulating parts 22 of the anisotropically conductive elements 24. In the illustrated embodiment, the insulating layer 29 is integral with the insulating parts 22 of the anisotropically conductive elements 24, but may be separate from the insulating parts 22.

Figure 5:
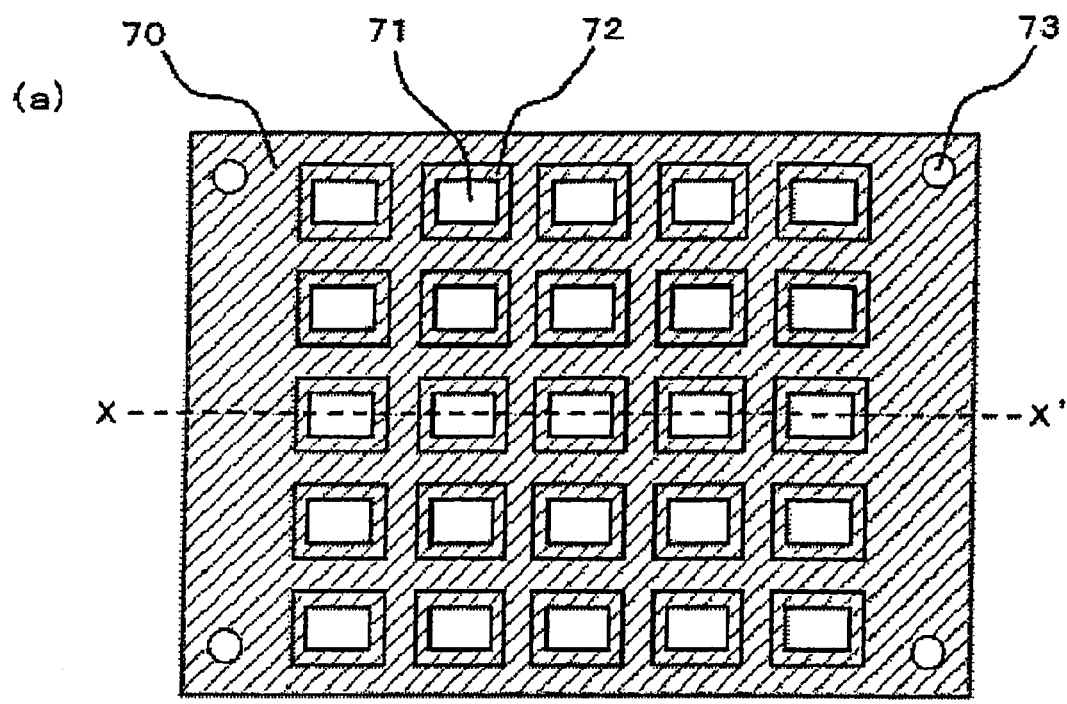
FIG. 5 illustrates the construction of a supporting member used in the anisotropically conductive connector according to the present invention, in which (a) is a plan view, and (b) is a cross-sectional view taken along line X-X' in (a).
Figure 5:
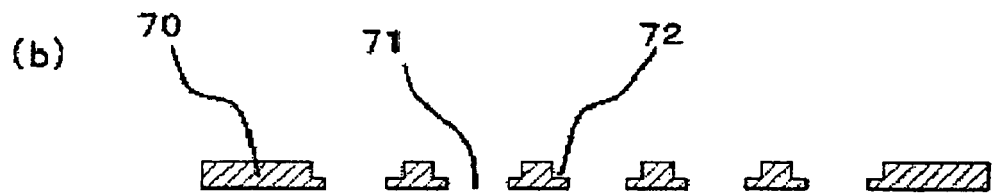
Figure 6:
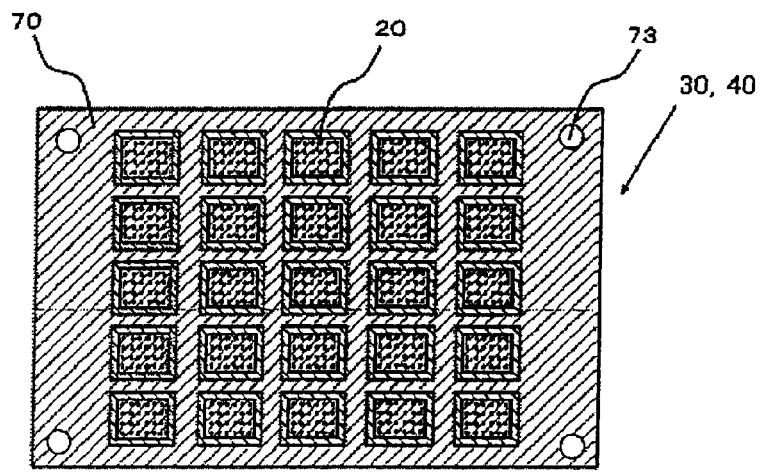
FIG. 6 illustrates the construction of the anisotropically conductive connector according to the present invention, in which (a) is a plan view, and (b) is a fragmentary sectional view.
Figure 6:
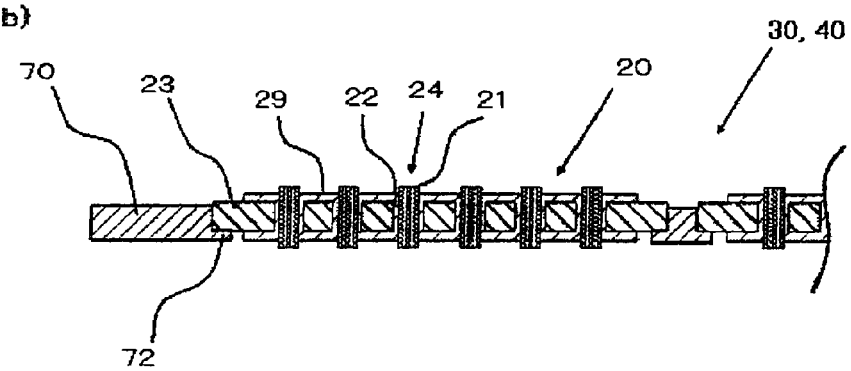

As also illustrated in FIG. 5, a plurality of through-holes 71 each extending in the thickness-wise direction are formed in the supporting member 70 in the first anisotropically conductive connector 30 so as to align crosswise, and a holding part 72 is formed at an inner edge part of each through-hole 71 in one surface of the supporting member 70. As illustrated in FIG. 6, the anisotropically conductive sheet 20 is arranged in each of the through-holes 71 of the supporting member 70, and an outer edge part of the frame plate 23 in the anisotropically conductive sheet 20 is fixed and held by the holding part 72 of the supporting member 70.

No particular limitation is imposed on the means for fixing the anisotropically conductive sheet 20 to the supporting member 70. For example, the anisotropically conductive sheet 20 may be fixed to the supporting member 70 by fitting the frame plate 23 of the anisotropically conductive sheet 20 in the holding part 72 of the supporting member 70 or by joining the holding part 72 of the supporting member 70 and the frame plate 23 of the anisotropically conductive sheet 20 by a guide pin or bonding them with an adhesive.

In the illustrated embodiment, positioning holes 73 each extending through in a thickness-wise direction of the supporting member 70 are respectively formed at positions of four corners of the supporting member 70, whereby the first anisotropically conductive connector 30 can be arranged in such a manner that the conductive parts 21 of the anisotropically conductive elements 24 in each of the anisotropically conductive sheet 20 are located on the respective front-surface electrode parts 14 in the connecting board 11 by positioning the supporting member 70 and the connecting board 11 using the positioning holes 73.

As a material forming the supporting member 70, is preferably used that exemplified as the hard material forming the frame plate 23 in the anisotropically conductive sheet 20.

Such a hard material is used as the material forming the supporting member 70, whereby the conductive parts 21 in the anisotropically conductive elements 24 of the anisotropically conductive sheet 20 can be surely prevented from being displaced in the plane direction even when temperature change is caused.

As the hard material forming the supporting member 70, is preferably used that having a coefficient of linear thermal expansion equal or approximate to the coefficient of linear thermal expansion of a material forming a base of a circuit board to be connected, specifically a coefficient of linear thermal expansion that a difference from the coefficient of linear thermal expansion of the material forming the base of the circuit board to be connected is at most $1 \times 10^{-5}$/K.

The second anisotropically conductive connector 40 basically has the same construction as the first anisotropically conductive connector 30 (see FIG. 3 to FIG. 6) and is composed of a supporting member 70, in which a plurality of through-holes 71 each extending in a thickness-wise direction of the supporting member have been formed, and anisotropically conductive sheets 20 respectively held in the through-holes 71 of the supporting member 70. Each of the anisotropically conductive sheets 20 has a frame plate 23 composed of, for example, a hard material, in which a plurality of through-holes 23K each extending in a thickness-wise direction of the frame plate and having a rectangular sectional form have been formed in accordance with a specific pattern.

The specific pattern of the through-holes 23K in this frame plate 23 is arranged in accordance with a pattern corresponding to the pattern of the back-surface electrode parts 15 in the connecting board 11.

Guide pins 9 are inserted into positioning holes (not illustrated) formed in the connecting board 11 and the positioning holes 73 respectively formed in the first anisotropically conductive connector 30 and the second anisotropically conductive connector 40, whereby the connecting board 11, the first anisotropically conductive connector 30 and the second anisotropically conductive connector 40 are positioned and fixed to one another.

Each of the anisotropically conductive sheets 20 in the first anisotropically conductive connector 30 and the second anisotropically conductive connector 40 can be produced, for example, in the following manner.

Figure 7:
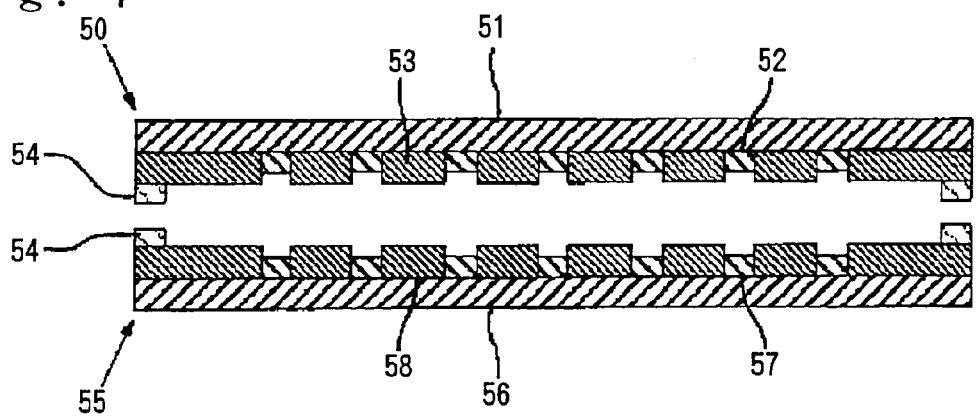
FIG. 7 is a cross-sectional view illustrating the construction of an exemplary mold for producing an anisotropically conductive sheet.

FIG. 7 is a cross-sectional view illustrating the construction of an exemplary mold used for producing the anisotropically conductive sheet 20. This mold is so constructed that a top force 50 and a bottom force 55 making a pair therewith are arranged so as to be opposed to each other through a frame-like spacer 54. A cavity is defined between a lower surface of the top force 50 and an upper surface of the bottom force 55. In the top force 50, ferromagnetic substance layers 52 are formed in accordance with a pattern antipodal to an arrangement pattern of the conductive parts 21 in the anisotropically conductive elements 24 of the intended anisotropically conductive sheet on a lower surface of a ferromagnetic substance substrate 51, and non-magnetic substance layers 53 having a thickness greater than the thickness of the ferromagnetic substance layers 52 are formed at other places than the ferromagnetic substance layers 52. In the bottom force 55 on the other hand, ferromagnetic substance layers 57 are formed in accordance with the same pattern as the arrangement pattern of the conductive parts 21 in the anisotropically conductive elements 24 of the intended anisotropically conductive sheet on an upper surface of a ferromagnetic substance substrate 56, and non-magnetic substance layers 58 having a thickness greater than the thickness of the ferromagnetic substance layers 57 are formed at other places than the ferromagnetic substance layers 57.

As a material for forming the respective ferromagnetic substance substrates 51 and 56 in the top force 50 and the bottom force 55, may be used a ferromagnetic metal such as iron, iron-nickel alloy, iron-cobalt alloy, nickel or cobalt. The ferromagnetic substance substrates 51 and 56 each preferably have a thickness of 0.1 to 50 mm, and are preferably smooth at surfaces thereof and subjected to a chemical degreasing treatment or mechanical polishing treatment.

As a material for forming the ferromagnetic substance layers 52 and 57 in both top force 50 and bottom force 55, may be used a ferromagnetic metal such as iron, iron-nickel alloy, iron-cobalt alloy, nickel or cobalt. The ferromagnetic substance layers 52 and 57 each preferably have a thickness of at least 10 μm. If this thickness is smaller than 10 μm, it is difficult to apply a magnetic field having a sufficient intensity distribution to a molding material layer formed within the mold. As a result, it is difficult to gather the conductive particles at a high density at portions to become conductive parts in the molding material layer, and so a sheet having good anisotropic conductivity may not be provided in some cases.

As a material for forming the non-magnetic substance layers 53 and 58 in both top force 50 and bottom force 55, may be used a non-magnetic metal such as copper, a polymeric substance having heat resistance, or the like. However, a polymeric substance cured by radiation is preferably used in that the non-magnetic substance layers 53 and 58 can be easily formed by a technique of photolithography. As a material thereof, may be used, for example, a photoresist such as an acrylic type dry film resist, epoxy type liquid resist or polyimide type liquid resist. The thickness of the non-magnetic substance layers 53 and 58 is preset according to the projected height of the conductive parts 21 in the intended anisotropically conductive sheet 20.

The above-described mold is used to produce the anisotropically conductive sheet 20 in the following manner.

Figure 8:
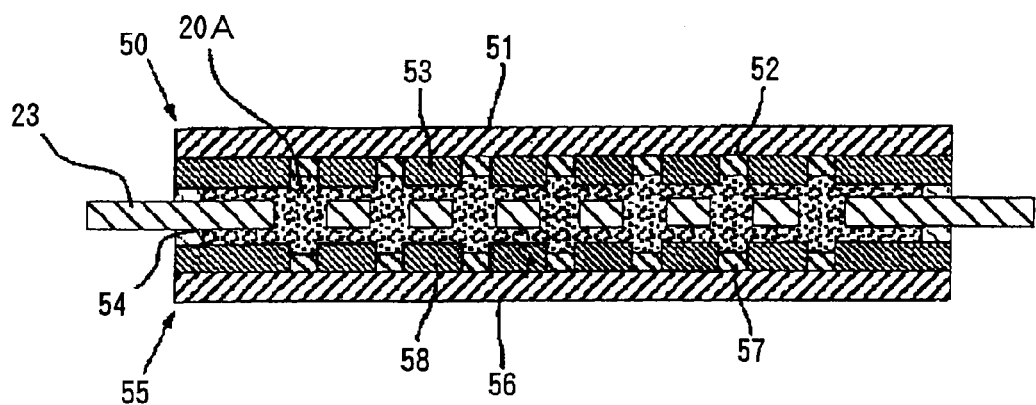
FIG. 8 is a cross-sectional view illustrating a state that a molding material layer has been formed in the mold.
Figure 9:
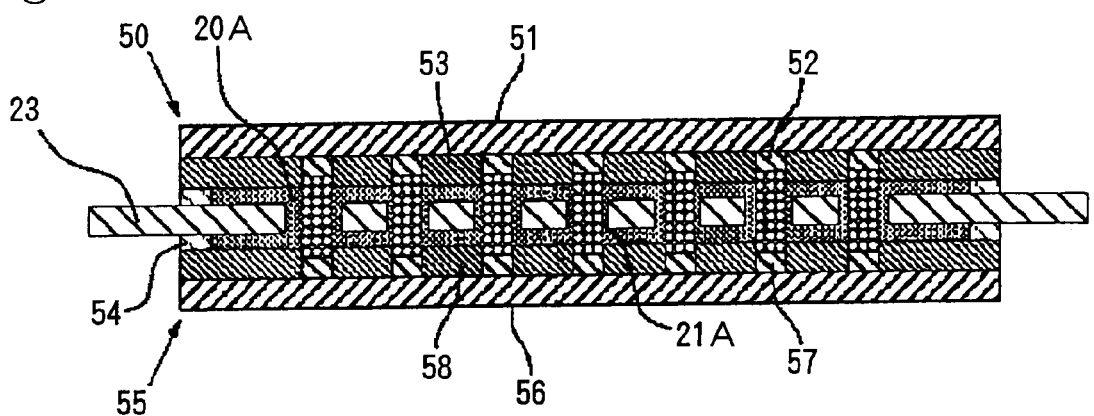
FIG. 9 is a cross-sectional view illustrating a state that a magnetic field has been applied to the molding material layer in a thickness-wise direction thereof.

A fluid molding material is first prepared by dispersing conductive particles exhibiting magnetism in a curable polymeric substance-forming material, and as illustrated in FIG. 8, this molding material is charged into the cavity of the mold to form a molding material layer 20A, and a frame plate 23 is provided in the molding material layer 20A in a state that the through-holes 23K are positioned between the ferromagnetic substance layers 52 of the top force 50 and their corresponding ferromagnetic substance layers 57 of the bottom force 55. A pair of, for example, electromagnets (not illustrated) are then arranged on the upper surface of the ferromagnetic substance substrate 51 in the top force 50 and on the lower surface of the ferromagnetic substance substrate 56 in the bottom force 55 and operated, whereby a parallel magnetic field having a strength distribution, i.e., a parallel magnetic field having higher intensity at portions between the ferromagnetic substance layers 52 of the top force 50 and their corresponding ferromagnetic substance layers 57 of the bottom force 55, is applied to the molding material layer 20A in a thickness-wise direction thereof. As a result, in the molding material layer 20A, the conductive particles dispersed in the molding material layer 20A are gathered at portions 21A to become the conductive parts located between the respective ferromagnetic substance layers 52 of the top force 50 and their corresponding ferromagnetic substance layers 57 of the bottom force 55, and oriented so as to align in a thickness-wise direction of the molding material layer 20A as illustrated in FIG. 9.

In this state, the molding material layer 20A is subjected to a curing treatment, whereby anisotropically conductive elements 24, which are arranged between the ferromagnetic substance layers 52 of the top force 50 and their corresponding ferromagnetic substance layers 57 of the bottom force 55 and each have a conductive part 21, in which the conductive particles are densely charged in the elastic polymeric substance in a state oriented so as to align in the thickness-wise direction, and an insulating part 22 formed so as to surround the periphery of the conductive part, in which the conductive particles are not present at all or scarcely present, are formed in a state held by the respective through-holes 23K of the frame plate 23, and an insulating layer 29 is formed so as to cover the surface of the frame plate 23, thus producing an anisotropically conductive sheet of the construction illustrated in FIG. 4.

In the above-described process, the curing treatment of the molding material layer 20A may be conducted in a state that the parallel magnetic field has been applied as it is, or may also be conducted after the application of the parallel magnetic field has been stopped. The intensity of the parallel magnetic field applied to the molding material layer 20A is preferably an intensity that it amounts to 200 to 10,000 gauss on the average. As a means for applying the parallel magnetic field to the molding material layer 20A, permanent magnets may also be used in place of the electromagnets. As the permanent magnets, are preferred those composed of alnico (Fe—Al—Ni—Co alloy), ferrite or the like in that the intensity of a parallel magnetic field within the above range is achieved. The curing treatment of the molding material layer 20A is suitably selected according to the material used. However, the treatment is generally conducted by a heat treatment. Specific heating temperature and heating time are suitably selected in view of the kinds of the polymeric substance-forming material making up the molding material layer 20A, and the like, the time required for movement of the conductive particles, etc.

Figure 10:
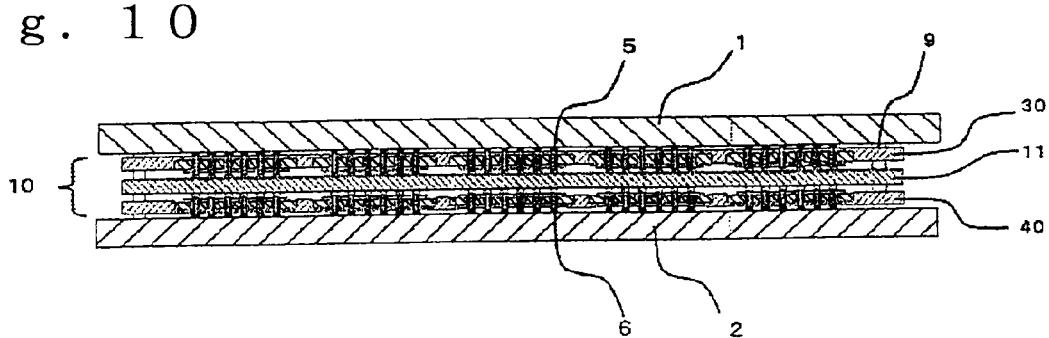
FIG. 10 is a cross-sectional view illustrating a state that electrical connection of circuit boards in a wafer inspection apparatus has been achieved by using the anisotropically conductive connector device according to the present invention.
Figure 11:
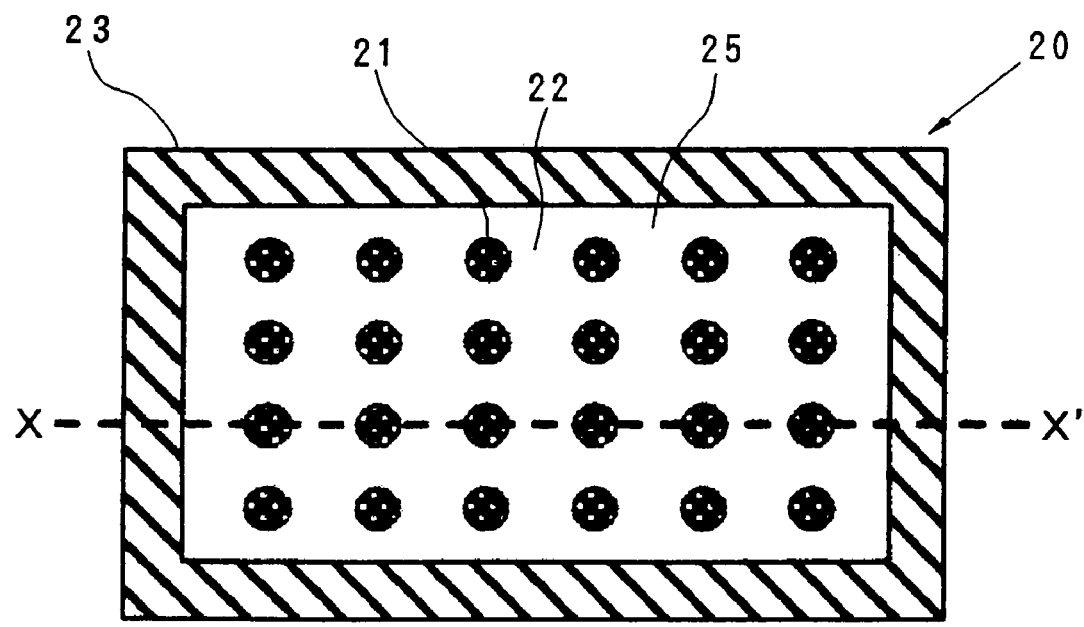
FIG. 11 illustrates the construction of another exemplary anisotropically conductive sheet used in the anisotropically conductive connector according to the present invention, in which (a) is a plan view, and (b) is a cross-sectional view taken along line X-X' in (a).
Figure 11:
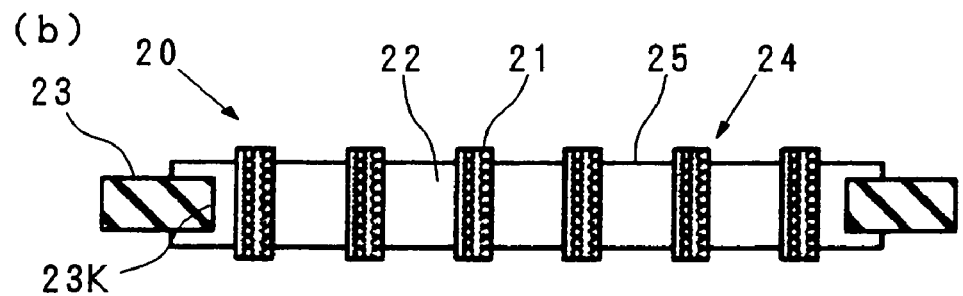

FIG. 10 is a cross-sectional view illustrating a state that electrical connection of circuit boards in a wafer inspection apparatus has been achieved by using the anisotropically conductive connector device 10 according to the present invention.

In this wafer inspection apparatus, the anisotropically conductive connector device 10 is arranged between a circuit board 1 for inspection and a circuit board 2 for connection in such a manner that the first anisotropically conductive connector 30 comes into contact with the circuit board 1 for inspection, and the second anisotropically conductive connector 40 comes into contact with the circuit board 2 for connection.

The conductive parts 21 of the first anisotropically conductive connector 30 are electrically connected to their corresponding electrodes 5 of the circuit board 1 for inspection, and the conductive parts 21 of the second anisotropically conductive connector 40 are electrically connected to their corresponding electrodes 6 of the circuit board 2 for connection, whereby electrical connection of the electrodes 5 of the circuit board 1 for inspection to the electrode 6 of the circuit board 2 for connection is achieved.

According to the above-described first anisotropically conductive connector 30 and second anisotropically conductive connector 40, a plurality of anisotropically conductive sheets 20 small in area and little in the number of conductive parts 21 are joined to one another by the supporting member 70, so that electrical properties within a certain range can be surely achieved in all the conductive parts 21 even when the connectors have a large area and a great number of conductive parts as a whole.

It is only necessary to produce anisotropically conductive sheets 20 small in area and little in the number of conductive parts 21, so that large-sized mold and molding machine are not required, and the anisotropically conductive connectors can thus be produced at low cost.

When the conductivity of the conductive parts 21 of the anisotropically conductive sheets 20 arranged in, for example, the peripheral region of the supporting member 70 is lowered, and the use of their conductive parts becomes difficult when the anisotropically conductive connector is used repeatedly many times in, for example, inspection of wafers, it is only necessary to exchange only the anisotropically conductive sheet 20 containing such conductive parts 21 for a new anisotropically conductive sheet, so that the whole anisotropically conductive connector is not required to be exchanged for a new anisotropically conductive connector, and inspection cost can thus be reduced.

According to the anisotropically conductive connector device 10 of the present invention, the connecting board 11 is arranged between the first anisotropically conductive connector and the second anisotropically conductive connector, so that good electrical connection can be achieved with a low pressure for circuit boards wide in a scatter of height, and a long working life is achieved even when it is used repeatedly.

The present invention is not limited to the above-described embodiments, and various changes or modifications may be added thereto.

(1) The anisotropically conductive connector device according to the present invention can be used in inspection of circuit devices, and electrodes to be inspected of a circuit device, which is an object of inspection, may be semispherical solder ball electrodes, lead electrodes or flat plate electrodes.

(2) The anisotropically conductive sheet 20 used in the first anisotropically conductive connector 30 and the second anisotropically conductive connector 40 may be that composed of a frame plate 23 in which a sole through-hole 23K has been formed and an anisotropically conductive film 25 arranged in and fixed to the through-hole 23K of the frame plate 23, in which insulating parts 22 of plural anisotropically conductive elements 24 are joined integrally with one another.

(3) The anisotropically conductive sheet 20 may be either that, both conductive parts 21 and insulating parts 22 of which form a flat surface on both surfaces of the sheet, or that in which a projected portion protruding from the surface of the insulating part 22 is formed at one surface of the conductive part 21 on one surface thereof.

(4) Any one or both of the first anisotropically conductive connector 30 and the second anisotropically conductive connector 40 may be integrally bonded to the connecting board.

(5) In the anisotropically conductive sheet 20, conductive parts, which are not electrically connected to electrodes of the connecting board and the circuit board, may be formed at proper positions in addition to the conductive parts electrically connected to electrodes of the connecting board 11 and the circuit board.

(6) The anisotropically conductive connector 10 according to the present invention is not limited to that used for electrically connecting circuit boards to each other, and may be that used for electrical connection of an electronic part to a circuit board or electrical connection of electronic parts to each other.

No particular limitation is imposed on an electronic part that is an object of connection by the anisotropically conductive connector device 10 according to the present invention, and any of various electronic parts may be used. Examples thereof include active devices composed of a semiconductor device such as a transistor, diode, relay, switch, IC chip, LSI chip or a package thereof, or MCM (multi chip module), passive parts such as resistors, capacitors, quartz oscillators, speakers, microphones, transformers (coils) and inductors; and display panels such as TFT type liquid crystal display panels, STN type liquid crystal display panels, plasma display panels and electroluminescence panels. As the circuit board, may be used those of various structures, such as a single-sided printed circuit board, double-sided printed circuit board, multi-layer printed circuit board, ceramic board and glass board. The circuit board may be any of a flexible board, rigid board and a flexible-rigid board composed of a combination thereof.

(7) It is not essential to arrange anisotropically conductive connectors on both surfaces of the connecting board when the anisotropically conductive connector device is fabricated by using the anisotropically conductive connector according to the present invention. As needed, the anisotropically conductive connector may be arranged on only one surface according to an electronic part or the circuit board, which is an object of connection.

(8) In the anisotropically conductive connector according to the present invention, the form of the conductive parts of the anisotropically conductive sheet is not limited to the columnar form, and may be a square prismatic form. No particular limitation is also imposed on the form of the through-holes in the frame plate of the anisotropically conductive sheet, and the sectional form thereof is not limited to a circular form, and may be a quadrangular form or the like.

The invention claimed is:

1. An anisotropically conductive connector comprising:
a supporting member having a first plurality of through-holes, each of the first plurality of through-holes extending in a thickness-wise direction of the supporting member, and
anisotropically conductive sheets respectively held in the first plurality of through-holes of the supporting member, each of the anisotropically conductive sheets is composed of:
  a frame plate having a second plurality of through-holes, each of the second plurality of through-holes extending in a thickness-wise direction of the frame plate, and
  a plurality of anisotropically conductive elements arranged in the second plurality of through-holes of the frame plate, each of the plurality of anisotropically conductive elements is formed by a conductive part having conductive particles contained in an elastic polymeric substance in a state oriented so as to align in a thickness-wise direction of the each of the plurality of anisotropically conductive elements, and an insulating part formed so as to cover an outer periphery of the conductive part and composed of the elastic polymeric substance, the conductive part is formed protruding from a surface of the insulating part, and
  an insulating layer composed of the elastic polymeric substance is formed so as to cover a surface of the frame plate of the each of the anisotropically conductive sheets,
wherein the plurality of anisotropically conductive sheets comprises a first plurality of anisotropically conductive sheets arranged in a peripheral region of the supporting member and a second plurality of anisotropically conductive sheets arranged in a central region of the supporting member, and
a thickness of each of the conductive part of the first plurality of anisotropically conductive sheets is smaller than a thickness of the each of the conductive part of the second plurality of anisotropically conductive sheets.

2. An anisotropically conductive connector comprising:
a supporting member having a first plurality of through-holes, each of the first plurality of through-holes extending in a thickness-wise direction of the supporting member, and
anisotropically conductive sheets respectively held in the first plurality of through-holes of the supporting member, each of the anisotropically conductive sheets is composed of:
  a frame plate having a second plurality of through-holes, each of the second plurality of through-holes extending in a thickness-wise direction of the frame plate, and
  a plurality of anisotropically conductive elements arranged in the second plurality of through-holes of the frame plate, each of the plurality of anisotropically conductive elements is formed by a conductive part having conductive particles contained in an elastic polymeric substance in a state oriented so as to align in a thickness-wise direction of the each of the plurality of anisotropically conductive elements, and an insulating part formed so as to cover an outer periphery of the conductive part and composed of the elastic polymeric substance, the conductive part is formed protruding from a surface of the insulating part, and
  an insulating layer composed of the elastic polymeric substance is formed so as to cover a surface of the frame plate of the each of the anisotropically conductive sheets,
wherein the plurality of anisotropically conductive sheets comprises a first plurality of anisotropically conductive sheets arranged in a peripheral region of the supporting member and a second plurality of anisotropically conductive sheets arranged in a central region of the supporting member, and
a durometer hardness of a first composition of the elastic polymeric substance forming each of the conductive part of the first plurality of anisotropically conductive sheets is higher than a durometer hardness of a second composition of the elastic polymeric substance forming the each of the conductive part of the second plurality of anisotropically conductive sheets.

3. An anisotropically conductive connector comprising:
a supporting member having a first plurality of through-holes, each of the first plurality of through-holes extending in a thickness-wise direction of the supporting member, and
anisotropically conductive sheets respectively held in the first plurality of through-holes of the supporting member, each of the anisotropically conductive sheets is composed of:
  a frame plate having a second plurality of through-holes, each of the second plurality of through-holes extending in a thickness-wise direction of the frame plate, and
  a plurality of anisotropically conductive elements arranged in the second plurality of through-holes of the frame plate, each of the plurality of anisotropically conductive elements is formed by a conductive part having conductive particles contained in an elastic polymeric substance in a state oriented so as to align in a thickness-wise direction of the each of the plurality of anisotropically conductive elements, and an insulating part formed so as to cover an outer periphery of the conductive part and composed of the elastic polymeric substance, the conductive part is formed protruding from a surface of the insulating part, and
  an insulating layer composed of the elastic polymeric substance is formed so as to cover a surface of the frame plate of the each of the anisotropically conductive sheets,
wherein the plurality of anisotropically conductive sheets comprises a first plurality of anisotropically conductive sheets arranged in a peripheral region of the supporting member and a second plurality of anisotropically conductive sheets arranged in a central region of the supporting member, and
a content of the conductive particles contained in each of the conductive part of the first plurality of anisotropically conductive sheets is higher than a content of the conductive particles contained in the each of the conductive part of the second plurality of anisotropically conductive sheets.

* * * * *